(12) United States Patent
Kim et al.

(10) Patent No.: US 10,504,986 B2
(45) Date of Patent: Dec. 10, 2019

(54) DISPLAY DEVICE

(71) Applicant: Samsung Display Co., Ltd., Yongin-si, Gyeonggi-do (KR)

(72) Inventors: Byoung Yong Kim, Seoul (KR); Seung-Soo Ryu, Hwaseong-si (KR); Jung Yun Jo, Namyangju-si (KR); Jeong Ho Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/836,715

(22) Filed: Dec. 8, 2017

(65) Prior Publication Data

US 2018/0166526 A1 Jun. 14, 2018

(30) Foreign Application Priority Data

Dec. 9, 2016 (KR) ........................ 10-2016-0167934

(51) Int. Cl.
*H01L 27/32* (2006.01)
*H01L 51/52* (2006.01)
*G06F 3/041* (2006.01)
*G06F 3/0354* (2013.01)
*G06F 3/044* (2006.01)

(52) U.S. Cl.
CPC ...... *H01L 27/3276* (2013.01); *G06F 3/03547* (2013.01); *G06F 3/041* (2013.01); *G06F 3/0412* (2013.01); *H01L 27/32* (2013.01); *H01L 27/323* (2013.01); *H01L 27/3246* (2013.01); *H01L 27/3258* (2013.01); *H01L 27/3262* (2013.01); *H01L 51/52* (2013.01); *H01L 51/5256* (2013.01); *G06F 3/044* (2013.01); *H01L 2251/5392* (2013.01); *H01L 2251/558* (2013.01)

(58) Field of Classification Search
None
See application file for complete search history.

(56) References Cited

U.S. PATENT DOCUMENTS

2014/0042394 A1* 2/2014 Lee ................... H01L 51/5203
257/40
2014/0374704 A1* 12/2014 Jang .................. H01L 51/0097
257/40

(Continued)

FOREIGN PATENT DOCUMENTS

| KR | 10-2008-0050679 A | 6/2008 |
|---|---|---|
| KR | 10-1353269 B1 | 1/2014 |
| KR | 10-2016-0035168 A | 3/2016 |

*Primary Examiner* — Robin J Mishler
(74) *Attorney, Agent, or Firm* — Lewis Roca Rothgerber Christie LLP

(57) ABSTRACT

A display device includes: a substrate; a pad portion in a non-display area of the substrate and including a plurality of pads; a driver arranged at the pad portion to contact the pads; an interlayer insulating layer on the substrate; and an auxiliary layer in the non-display area, and each of the pads includes a first pad electrode, a second pad electrode, and a third pad electrode, which are sequentially arranged on the substrate, a width of the third pad electrode is greater than a width of the second pad electrode and a width of the first pad electrode, and a thickness of the auxiliary layer between the third pad electrode and the interlayer insulating layer is thicker than a thickness of the auxiliary layer between the third pad electrode and the second pad electrode.

20 Claims, 9 Drawing Sheets

(56) References Cited

U.S. PATENT DOCUMENTS

2016/0233357 A1 8/2016 Lee et al.
2016/0234938 A1 8/2016 Stone
2017/0345882 A1* 11/2017 Nam ................... H01L 27/322

* cited by examiner

DISPLAY DEVICE

CROSS-REFERENCE TO RELATED APPLICATION

This application claims priority to and the benefit of Korean Patent Application No. 10-2016-0167934, filed on Dec. 9, 2016 in the Korean Intellectual Property Office, the entire content of which is incorporated herein by reference.

BACKGROUND

1. Field

Aspects of embodiments of the present disclosure relate to a display device.

2. Description of the Related Art

A display device includes a substrate and a plurality of signal lines and transistors disposed on the substrate. In addition, a driver including an integrated circuit for generating various signals for driving the display device may be disposed in a predetermined portion, i.e. a pad portion, of the substrate.

An anisotropic conductive film (ACF) is used for electrical connection and physical connection between a driver and the substrate. The anisotropic conductive film, which is a film in which conductive particles are arranged in an insulating layer such as a resin, is conductive in a thickness direction thereof and is insulative in a surface direction thereof.

A plurality of pads is disposed at the pad portion. When the driver and the substrate are combined, a short circuit may occur between adjacent pads, or a bump electrode of the driver and the pads may not be properly coupled.

The above information disclosed in this Background section is only for enhancement of understanding of the background of the invention and, therefore, it may contain information that does not form the prior art that is already known in this country to a person of ordinary skill in the art.

SUMMARY

According to an aspect of one or more exemplary embodiments, a stable connection is provided between a driver and a substrate.

According to one or more exemplary embodiments of the present invention, a display device includes: a substrate including a display area configured to display an image and a non-display area positioned outside the display area; a pad portion arranged in the non-display area of the substrate and including a plurality of pads; a driver arranged at the pad portion to contact the pads; an interlayer insulating layer on the substrate; and an auxiliary layer in the non-display area of the substrate. Each of the pads includes a first pad electrode, a second pad electrode, and a third pad electrode, which are sequentially arranged on the substrate, and a width of the third pad electrode is greater than a width of the second pad electrode and a width of the first pad electrode. The interlayer insulating layer is between the substrate and the second pad electrode, and the auxiliary layer is between the second pad electrode and the third pad electrode. A thickness of the auxiliary layer between the third pad electrode and the interlayer insulating layer is thicker than a thickness of the auxiliary layer between the third pad electrode and the second pad electrode.

The auxiliary layer may include an organic material.

The driver may include: a circuit board configured to include a driving circuit; and a bump electrode arranged on a surface of the circuit board to contact the third pad electrode.

The display device may further include: a semiconductor layer arranged on the substrate in the display area; a gate insulating layer on the semiconductor layer; a gate electrode on the gate insulating layer; a source electrode and a drain electrode on the gate electrode; a planarization layer on the source electrode and the drain electrode; and a light emitting diode (LED) arranged on the planarization layer to be connected with the drain electrode, and the interlayer insulating layer may be between the gate electrode, the source electrode, and the drain electrode.

The first pad electrode may include a same material as a material of the gate electrode, and the second pad electrode may include a same material as a material of the source electrode and the drain electrode.

The light emitting diode (LED) may include: a first electrode on the planarization layer; an emission member on the first electrode; and a second electrode on the emission member.

The display device may further include: a pixel definition layer arranged on the planarization layer to overlap a portion of the first electrode; an encapsulation layer on the light emitting diode (LED); and a touch sensing layer on the encapsulation layer.

The touch sensing layer may include: a first sensing electrode on the encapsulation layer; a first touch insulating layer on the first sensing electrode; a second sensing electrode on the first touch insulating layer; and a second touch insulating layer on the second sensing electrode.

The third pad electrode may include a same material as a material of the first sensing electrode or the second sensing electrode.

The width of the third pad electrode may be greater than the width of the first pad electrode and the width of the second pad electrode in a plan view.

The auxiliary layer may include a same material as a material of the first touch insulating layer.

The third pad electrode may include a same material as a material of the second sensing electrode.

The auxiliary layer may include a same material as a material of the planarization layer.

The auxiliary layer may include a same material as a material of the pixel definition layer.

The encapsulation layer may include an inorganic layer and an organic layer which are alternately arranged.

The auxiliary layer may include a same material as a material of the organic layer. Each of the first pad electrode and the second pad electrode may include a plurality of branches.

An edge of the third pad electrode may be positioned outside of edges of the first pad electrode and the second pad electrode, in a plan view.

According to an aspect of one or more exemplary embodiments, the connection between the driver and the substrate may be stably performed by disposing an auxiliary layer having a thick thickness at the pad portion.

DESCRIPTION OF SYMBOLS

Figure 1:
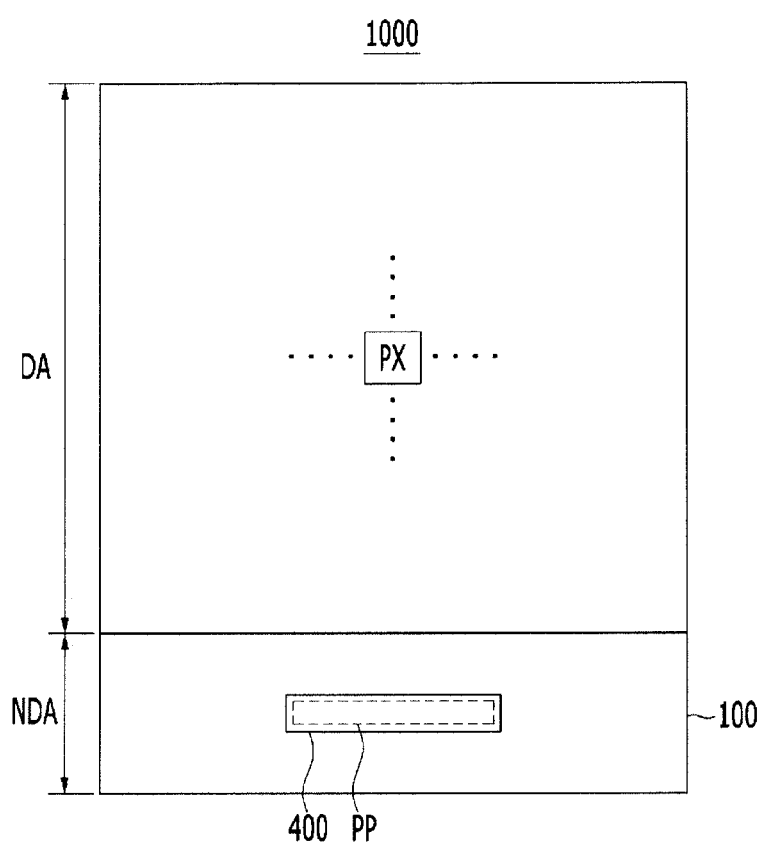
FIG. 1 schematically illustrates an example of a display device according to an exemplary embodiment of the present invention.

| | |
|---|---|
| P: pad | 140: gate electrode |
| 145: first pad electrode | 161: source electrode |
| 162: drain electrode | 165: second pad electrode |
| 170: planarization layer | 190: pixel definition layer |
| 200: encapsulation layer | 205: auxiliary layer |
| 300: touch sensing layer | 400: driver |

DETAILED DESCRIPTION

The present invention will be described more fully herein with reference to the accompanying drawings, in which some exemplary embodiments of the present invention are shown. As those skilled in the art would realize, the described embodiments may be modified in various different ways, all without departing from the spirit or scope of the present invention.

To more clearly describe the present invention, parts that are irrelevant to the description are omitted, and like numerals refer to like or similar constituent elements throughout the specification.

Further, sizes and thicknesses of constituent members shown in the accompanying drawings may be arbitrarily shown for better understanding and ease of description, but the present invention is not limited to the illustrated sizes and thicknesses. In the drawings, the thicknesses of layers, films, panels, regions, areas, etc., may be exaggerated for clarity.

It is to be understood that when an element, such as a layer, film, region, or substrate is referred to as being "on" another element, it may be directly on the other element, or one or more intervening elements may also be present. In contrast, when an element is referred to as being "directly on" another element, there are no intervening elements present. Further, words such as "over" or "on" mean positioning on or below the object portion, and do not necessarily mean positioning on the upper side of the object portion based on a gravity direction.

In addition, unless explicitly described to the contrary, the word "comprise" and variations such as "comprises" or "comprising" are to be understood to imply the inclusion of stated elements, but not the exclusion of any other elements.

Further, in the specification, the phrase "in a plan view" means when an object portion is viewed from above, and the phrase "in a cross-section" means when a cross-section taken by vertically cutting an object portion is viewed from the side.

A display device according to an exemplary embodiment of the present invention will be described with reference to FIG. 1.

FIG. 1 schematically illustrates an example of a display device according to an exemplary embodiment of the present invention.

Referring to FIG. 1, according to an exemplary embodiment, a display device 1000 includes a substrate 100 including a display area DA and a non-display area NDA positioned outside of the display area DA.

In an embodiment, the substrate 100 may be a flexible substrate including a material having excellent thermal resistance and durability, such as polyethylene naphthalate (PEN), polycarbonate (PC), polyarylate (PAR), polyether imide (PEI), polyether sulfone (PES), or polyimide (PI), but the present invention is not limited thereto. For example, the substrate 100 may include a flexible substrate made of any of various flexible materials.

The display area DA displays an image, and the non-display area NDA does not display an image. Elements and/or wires for generating and/or transferring various signals applied to the display area DA are disposed in the non-display area NDA. One edge region, i.e. a lower region of the substrate 100, is illustrated in FIG. 1 as the non-display area NDA. However, other sides, i.e. left and right side regions and/or an upper edge region of the substrate 100, may be the non-display area NDA. Further, the display area DA is shown to be quadrangular, but is not limited thereto, and may be circular, oval, or polygonal, for example.

A plurality of pixels PX are disposed, e.g., in a matrix form in the display area DA of the substrate 100. Further, signal lines, such as a plurality of gate lines (not illustrated), a plurality of data lines (not illustrated), and a plurality of driving voltage lines (not illustrated) are disposed in the display area DA. The gate lines may extend substantially in a row direction, and the data lines may extend substantially in a column direction crossing the row direction. In addition, the driving voltage lines may extend substantially in the column direction. The pixels PX may be respectively connected to the gate lines and the data lines to receive gate signals and data signals therefrom. The pixels PX may be respectively connected to the driving voltage lines to receive driving voltages.

A pad portion PP is disposed in the non-display area NDA of the substrate 100. A driver 400 is disposed on the pad portion PP. The driver 400 may generate a driving signal based on a signal input from the outside to be applied to each pixel PX. In an embodiment, for example, the driver 400 applies data signals to the data lines and applies gate signals to the gate lines.

In addition, a flexible printed circuit film for applying a driving signal or a control signal to the driver 400 and the pixels PX may be attached to the non-display area NDA of the substrate 100. An end of the flexible printed circuit film may be connected with an external printed circuit board (PCB) to transfer an image signal or a control signal from the external printed circuit board (PCB) to the driver 400 or the pixels PX.

Herein, a structure of the display device according to FIG. 1 will be described further with reference to FIG. 2 to FIG. 6.

Figure 2:
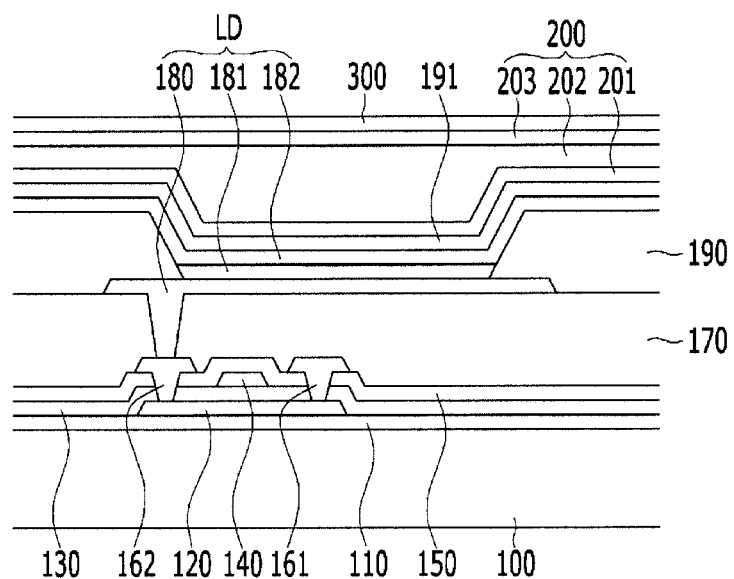
FIG. 2 schematically illustrates an example of a cross-section of a pixel of the display device according to FIG. 1.

FIG. 2 schematically illustrates an example of a cross-section of a pixel of the display device according to FIG. 1.

Figure 3:
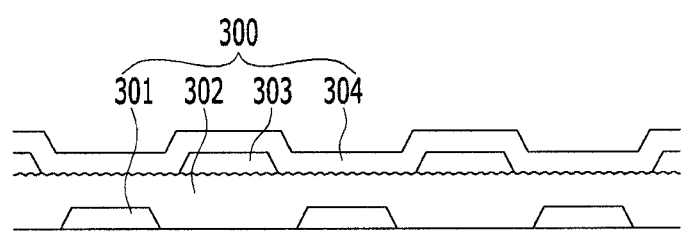
FIG. 3 schematically illustrates an example of a touch sensing layer of the display device according to FIG. 1.

FIG. 3 schematically illustrates an example of a touch sensing layer of the display device according to FIG. 1.

Referring to FIG. 2 and FIG. 3, a buffer layer 110 is disposed on the substrate 100. In an embodiment, the buffer layer 110 may be formed as a single layer of a silicon nitride (SiNx) or as a dual-layer structure in which a silicon nitride (SiNx) and a silicon oxide (SiOx) are stacked. The buffer layer 110 serves to planarize the surface while simultaneously preventing or substantially preventing unnecessary components, such as impurities or water, from infiltrating. In an embodiment, the buffer layer 110 may be omitted, depending on a type of the substrate 100 and a process condition.

A semiconductor layer 120 is disposed on the buffer layer 110. In an embodiment, the semiconductor layer 120 may include polycrystalline silicon or an oxide semiconductor.

A gate insulating layer 130 is disposed on the semiconductor layer 120 and the buffer layer 110. In an embodiment, the gate insulating layer 130 may be a single layer or a multilayer including at least one of a silicon nitride and a silicon oxide.

A gate electrode 140 is disposed on the gate insulating layer 130. The gate electrode 140 overlaps the semiconductor layer 120.

An interlayer insulating layer 150 is disposed on the gate electrode 140 and the gate insulating layer 130. In an embodiment, the interlayer insulating layer 150 may be a single layer or a multilayer including at least one of a silicon nitride and a silicon oxide.

A source electrode 161 and a drain electrode 162, which are spaced apart from each other, are disposed on the interlayer insulating layer 150. The source electrode 161 and the drain electrode 162 are connected with the semiconductor layer 120 through contact holes formed in the gate insulating layer 130 and the interlayer insulating layer 150. In an embodiment, a portion of the semiconductor layer 120 connected with the source electrode 161 and a portion of the semiconductor layer 120 connected with the drain electrode 162 are doped with impurities. In an embodiment, a portion of the semiconductor layer 120 overlapping the gate electrode 140, and disposed between a portion of the semiconductor layer 120 connected with the source electrode 161, and a portion of the semiconductor layer 120 disposed between the portion of the semiconductor layer 120 overlapped by the gate electrode 140 and a portion connected with the drain electrode 162, contain little impurities.

The gate electrode 140, the source electrode 161, and the drain electrode 162 constitute a transistor together with the semiconductor layer 120, and a channel is formed in a portion of the semiconductor layer 120 overlapping the gate electrode 140. The illustrated transistor may be a driving transistor in the pixel of the display device. The illustrated transistor may be a top-gate transistor in which the gate electrode 140 is disposed above the semiconductor layer 120. However, the structure of the transistor is not limited thereto, and may be variously modified. For example, the transistor may be a bottom gate transistor in which the gate electrode is disposed below the semiconductor.

A planarization layer 170 is disposed on the source electrode 161, the drain electrode 162, and the interlayer insulating layer 150. The planarization layer 170 may include an organic material, and an upper surface thereof may be planarized.

A light emitting diode (LED) LD and a pixel definition layer 190 are disposed on the planarization layer 170. The light emitting diode (LED) LD emits light depending on signals transferred from the transistor. The light emitting diode (LED) LD includes a first electrode 180, an emission member 181, and a second electrode 182.

The first electrode 180 is disposed on the planarization layer 170, and is electrically connected to the drain electrode 162 through a contact hole formed in the planarization layer 170. The first electrode 180 serves as an anode of the light emitting diode (LED) LD.

The first electrode 180 may include a reflective material, and, in an embodiment, may be formed of at least one metal of magnesium (Mg), silver (Ag), gold (Au), calcium (Ca), lithium (Li), chromium (Cr), and aluminum (Al), or an alloy thereof.

The pixel definition layer 190 is disposed on the planarization layer 170 to have an opening that overlaps the first electrode 180. The pixel definition layer 190 may include an organic material.

The emission member 181 is disposed on the first electrode 180 which is overlapped by the opening of the pixel definition layer 190. The emission member 181 may include one or more of an emission layer, a hole-injection layer (HIL), a hole-transporting layer (HTL), an electron-transporting layer (ETL), and an electron-injection layer (EIL). In an embodiment in which the emission member 181 includes all of the above-described layers, the hole-injection layer is disposed on the first electrode 180 serving as an anode, and the hole transport layer, the emission layer, the electron transport layer, and the electron injection layer may be sequentially stacked thereon. Herein, the emission layer may include an organic material, or may include an inorganic material.

The second electrode 182 is disposed on the pixel definition layer 190 and the emission member 181. The second electrode 182 may include a transparent material. In an embodiment, the second electrode 182 may include indium tin oxide (ITO), indium gallium oxide (IGO), or indium zinc oxide (IZO). Alternatively, the second electrode 182 may include a silver-magnesium (Ag—Mg) alloy, a silver-lithium (Ag—Li) alloy, silver (Ag), magnesium (Mg), or calcium (Ca), each of which has a thick thickness. The second electrode 182 serves as a cathode of the light emitting diode (LED) LD.

A capping layer 191 is disposed on the second electrode 182. The capping layer 191 serves to facilitate efficient emission of light generated from the emission member 181 toward an outside thereof.

An encapsulation layer 200 is disposed on the capping layer 191. The encapsulation layer 200 may encapsulate the light emitting diode (LED) LD to prevent or substantially prevent moisture or oxygen from penetrating from the outside. In an embodiment, the encapsulation layer 200 includes a first inorganic layer 201, an organic layer 202, and a second inorganic layer 203. The first inorganic layer 201 may be disposed on the capping layer 191, and includes an inorganic material. The organic layer 202 may be disposed on the first inorganic layer 201, and includes an organic material. In an embodiment, an upper surface of the organic layer 202 may be planarized. The second inorganic layer 203 may be disposed on the organic layer 202, and includes an inorganic material. In an embodiment, the encapsulation layer 200 may further include at least one organic layer and at least one inorganic layer which are sequentially disposed on the second inorganic layer 203. In this case, the organic layer and the inorganic layer may be alternately disposed.

A touch sensing layer 300 is disposed on the encapsulation layer 200. The touch sensing layer 300 can sense a touch when an object approaches the touch sensing layer 300 or touches the touch sensing layer 300. The contact includes a direct touch that represents a case in which an external object such as a user's finger directly touches a touch surface of the touch sensing layer 300, and a hovering touch that represents a case in which the external object approaches the touch sensing layer 300 or the external object hovers after it has approached the touch sensing layer 300.

In an embodiment, the touch sensing layer 300 includes a first sensing electrode 301 disposed on the encapsulation layer 200, a first touch insulating layer 302 disposed on the first sensing electrode 301, a second sensing electrode 303 disposed on the first touch insulating layer 302, and a second touch insulating layer 304 disposed on the second sensing electrode 303. The first sensing electrode 301 and the second sensing electrode 303 do not overlap each other. In an embodiment, for example, the first sensing electrode 301 and the second sensing electrode 303 are alternately positioned to be offset from each other. The first sensing electrode 301 and the second sensing electrode 303 may include a transparent conductive material, such as indium tin oxide (ITO) or indium zinc oxide (IZO). In an embodiment, the first touch insulating layer 302 may include an organic material. An upper surface of the first touch insulating layer 302 may have a fine concave-convex structure. Alternatively, the upper surface of the first touch insulating layer 302 may be planarized. The second touch insulating layer 304 may include an organic material.

Figure 4:
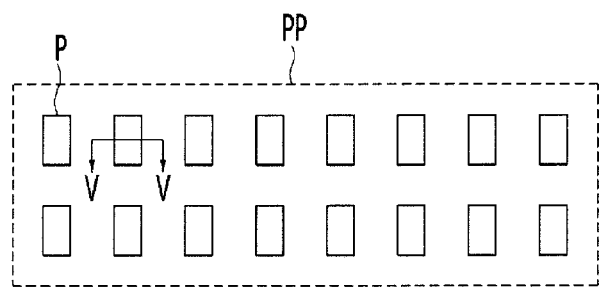
FIG. 4 schematically illustrates an example of a pad portion of the display device according to FIG. 1.
Figure 5:
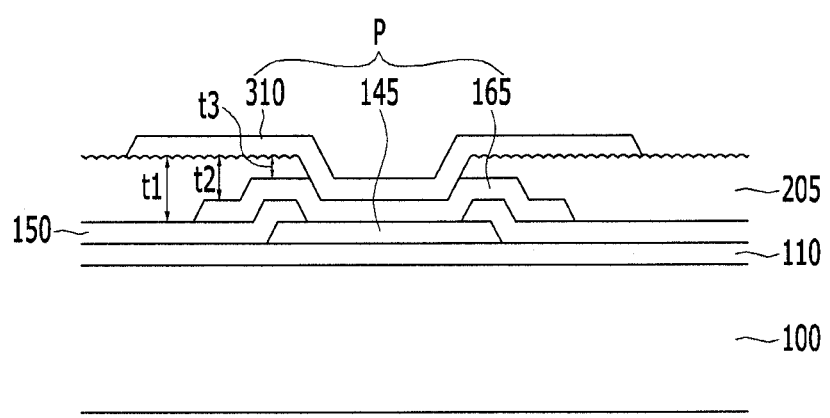
FIG. 5 schematically illustrates an example of a cross-section taken along a line V-V of FIG. 4.
Figure 6:
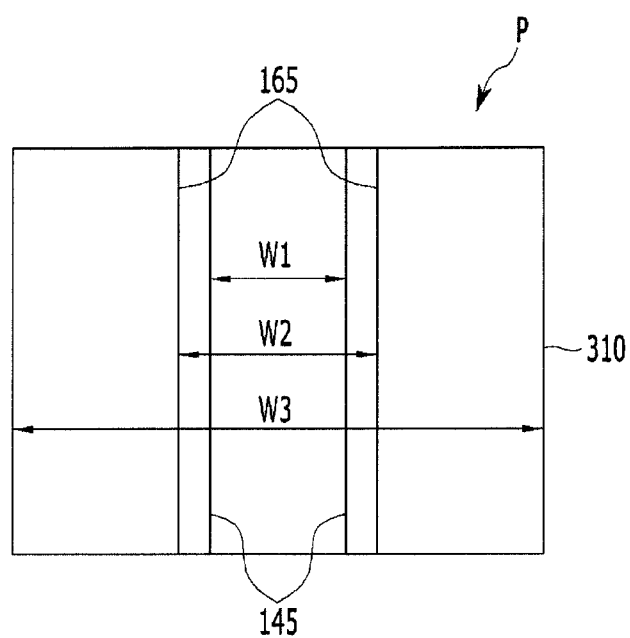
FIG. 6 schematically illustrates an example of a plan view of a pad of the display device according to FIG. 1.

FIG. 4 schematically illustrates an example of a pad portion of the display device according to FIG. 1. FIG. 5 schematically illustrates an example of a cross-section taken along a line V-V of FIG. 4. FIG. 6 schematically illustrates an example of a plan view of a pad of the display device according to FIG. 1.

Referring to FIG. 4, the pad portion PP includes a plurality of pads P. The pads P are spaced apart from each other and may have a substantially rectangular planar shape. However, the present invention is not limited thereto, and, unlike the illustrated exemplary embodiment, the pads P may have another planar shape, such as a parallelogram, as a whole.

Referring to FIG. 5, the pad P includes a first pad electrode 145, a second pad electrode 165, and a third pad electrode 310. Herein, FIG. 1 and FIG. 2 will be cross-referenced without any special mention in order to describe the display area DA.

A buffer layer 110 is disposed on the substrate 100, and the first pad electrode 145 is disposed on the buffer layer 110. In an embodiment, the first pad electrode 145 may include a same material as that of the gate electrode 140 disposed in the display area DA. In an embodiment, the first pad electrode 145 may be formed together with the gate electrode 140 by using a same process. Alternatively, the first pad electrode 145 and the gate electrode 140 may be formed separately by different processes. Further, although not illustrated, the gate insulating layer 130 may be disposed between the first pad electrode 145 and the buffer layer 110.

An interlayer insulating layer 150 is disposed on the first pad electrode 145 and the buffer layer 110, and the second pad electrode 165 is disposed on the interlayer insulating layer 150. The second pad electrode 165 is connected with the first pad electrode 145 through a contact hole formed in the interlayer insulating layer 150. In an embodiment, the second pad electrode 165 may include a same material as that of the source electrode 161 and the drain electrode 162 disposed in the display area DA. In an embodiment, the second pad electrode 165 may be formed by using a same process as that of the source electrode 161 and the drain electrode 162. Alternatively, the second pad electrode 165 may be separately formed by a different process from that of the source electrode 161 and the drain electrode 162.

An auxiliary layer 205 is disposed on the second pad electrode 165 and the interlayer insulating layer 150, and the third pad electrode 310 is disposed on the auxiliary layer 205. The third pad electrode 310 is connected with the second pad electrode 165 through a contact hole formed in the auxiliary layer 205. In an embodiment, the third pad electrode 310 may include a same material as that of the first sensing electrode 301 or the second sensing electrode 303 of the touch sensing layer 300 disposed in the display area DA. In an embodiment, the third pad electrode 310 may be formed together with the first sensing electrode 301 or the second sensing electrode 303 of the touch sensing layer 300 by a same process. Alternatively, the third pad electrode 310 may be separately formed by a different process from that of the first sensing electrode 301 or the second sensing electrode 303 of the touch sensing layer 300.

In an embodiment, the auxiliary layer 205 may include an organic material, and an upper surface of the auxiliary layer 205 may have a fine concave-convex structure. Alternatively, the upper surface of the auxiliary layer 205 may be planarized. In an embodiment, the auxiliary layer 205 may include a same material as that of the planarization layer 170 disposed in the display area DA, and, accordingly, the auxiliary layer 205 may be formed together with the planarization layer 170 by a same process.

In an embodiment, the auxiliary layer 205 may include a same material as that of the pixel definition layer 190 disposed in the display area DA, and, accordingly, the auxiliary layer 205 may be formed together with the pixel definition layer 190 by a same process.

In an embodiment, the auxiliary layer 205 may be disposed in the display area DA, and may include a same material as that of the organic layer 202 included in the encapsulation layer 200, and, accordingly, the auxiliary layer 205 may be formed together with the organic layer 202 included in the encapsulation layer 200 by a same process.

In an embodiment, the auxiliary layer 205 may include a same material as that of the first touch insulating layer 302 of the touch sensing layer 300, and, accordingly, the auxiliary layer 205 may be formed together with the first touch insulating layer 302 of the touch sensing layer 300 by a same process. In this case, the third pad electrode 310 may be formed together with the second sensing electrode 303 of the touch sensing layer 300 by a same process.

Herein, the auxiliary layer 205 includes a first portion t1, a second portion t2, and a third portion t3, which have different thicknesses. The thickness of the first portion t1 is thicker than that of the second portion t2 and the third portion t3.

The first portion t1 is disposed between the third pad electrode 310 and the interlayer insulating layer 150. An upper surface of the first portion t1 contacts the third pad electrode 310, and a lower surface of the first portion t1 contacts the interlayer insulating layer 150. The second portion t2 and the third portion t3 are positioned between the third pad electrode 310 and the second pad electrode 165. Upper surfaces of the second portion t2 and the third portion t3 contact the third pad electrode 310, and lower surfaces of the second portion t2 and the third portion t3 contact the second pad electrode 165.

Referring to FIG. 6, in a plan view, the first pad electrode 145 and the second pad electrode 165 overlap each other, and the third pad electrode 310 overlaps the first pad electrode 145 and the second pad electrode 165. A width W3 of the third pad electrode 310 is greater than a width W2 of the second pad electrode 165, and the width W2 of the second pad electrode 165 is greater than a width W1 of the first pad electrode 145. In an embodiment, the width W2 of the second pad electrode 165 may be about ⅓ of the width W3 of the third pad electrode 310.

The first portion t1 of the auxiliary layer 205 is disposed at a portion at which the third pad electrode 310 does not overlap the second pad electrode 165, in a plan view.

The pads P contact the driver 400 mounted at the pad portion PP. This will be described further with reference to FIG. 7.

Figure 7:
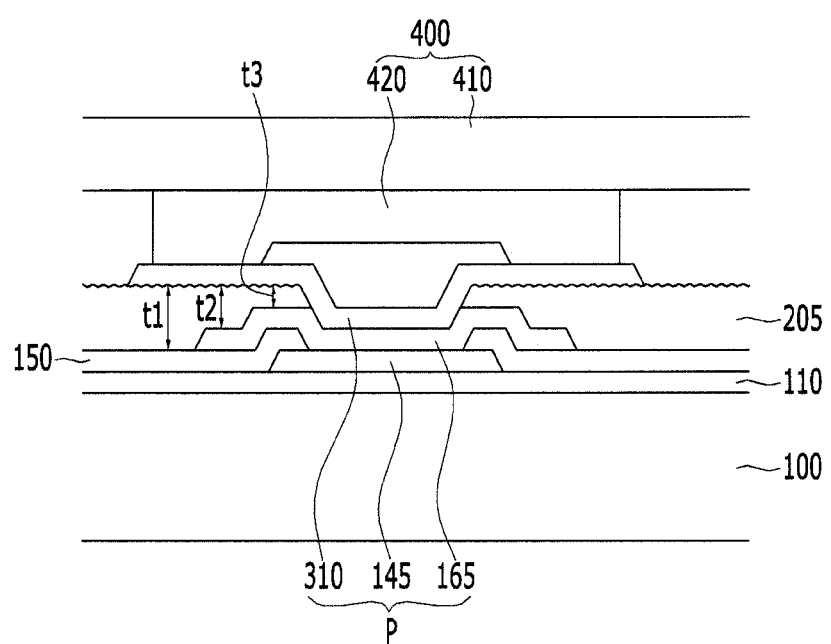
FIG. 7 schematically illustrates an example of a cross-section corresponding to a driver mounted at a pad portion in the display device according to FIG. 1.

FIG. 7 schematically illustrates an example of a cross-section corresponding to a driver mounted at a pad portion in the display device according to FIG. 1.

A driver corresponding to a pad will be described with reference to FIG. 7.

Referring to FIG. 7, the driver 400 includes a circuit board 410 including a driving circuit and a bump electrode 420. The bump electrode 420 is disposed on a first surface of the circuit board 410, to face the pads P. In an embodiment, the driver 400 is bonded and mounted to the pad portion PP by a non-conductive film (NCF) (not illustrated) which does not include conductive particles such as conductive balls.

When the driver 400 is mounted, the bump electrode 420 contacts the pad P. The bump electrode 420 contacts the third pad electrode 310. When the driver 400 is mounted, a pressure is applied. The first portion t1 of the auxiliary layer 205 may be positioned below the third pad electrode 310 contacted by the bump electrode 420, and, thus, an elastic force may be generated at the first portion t1 of the auxiliary layer 205 to stably maintain the contact between the bump electrode 420 and the third pad electrode 310.

As such, as the thick auxiliary layer 205 is disposed below the third pad electrode 310 of the pad P, an elastic force may be generated at the first portion t1 of the auxiliary layer 205 with respect to the pressure when the driver 400 is mounted at the pad portion PP, to stably maintain the contact between the driver 400 and the pad P.

Herein, a pad according to another exemplary embodiment of the present invention will be described with reference to FIG. 8 and FIG. 9.

Figure 8:
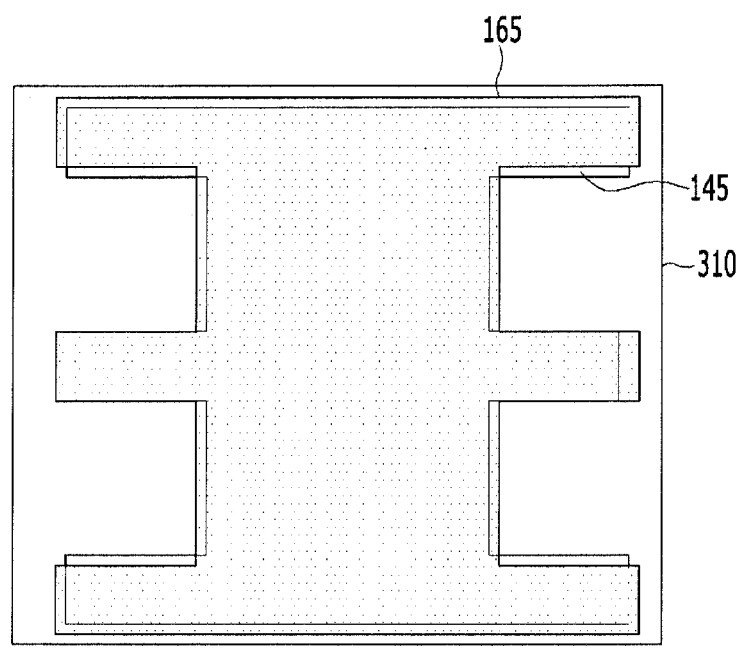
FIG. 8 schematically illustrates an example of a plan view of a pad according to an exemplary embodiment of the present invention.
Figure 9:
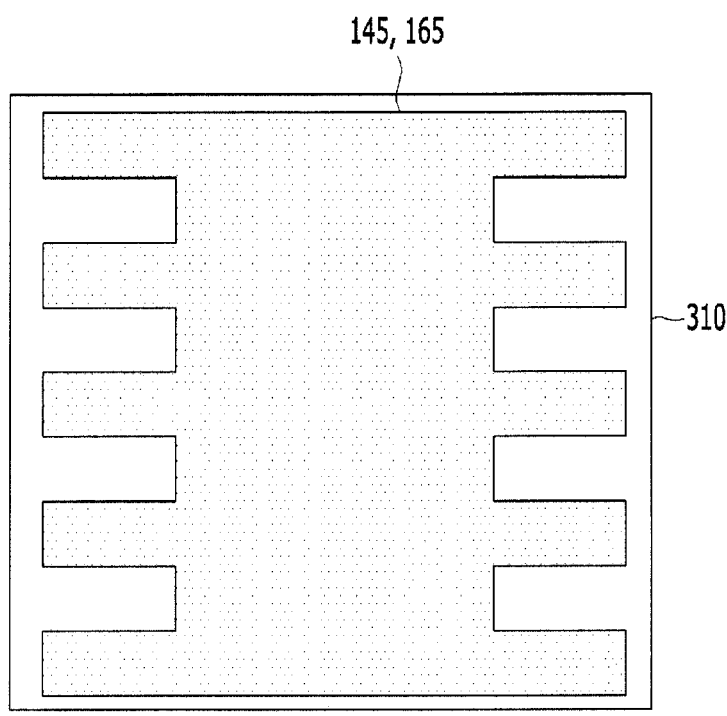
FIG. 9 schematically illustrates an example of a plan view of a pad according to an exemplary embodiment of the present invention.

FIG. 8 and FIG. 9 schematically illustrate an example of a plan view of a pad according to an exemplary embodiment of the present invention.

Referring to FIG. 8, in a plan view, the first pad electrode 145 and the second pad electrode 165 overlap each other, and the third pad electrode 310 overlaps the first pad electrode 145 and the second pad electrode 165. Each of the first pad electrode 145 and the second pad electrode 165 includes a plurality of branches.

In an embodiment, an edge of the second pad electrode 165 is positioned at an outside of an edge of the first pad electrode 145 in a plan view. However, the edge of the first pad electrode 145 may be positioned at an outside of the edge of the second pad electrode 165 in a plan view.

An edge of the third pad electrode 310 is positioned at an outside of the edges of the first pad electrode 145 and the second pad electrode 165 in a plan view.

Referring to FIG. 9, in a plan view, the first pad electrode 145 and the second pad electrode 165 overlap each other, and the third pad electrode 310 overlaps the first pad electrode 145 and the second pad electrode 165. Each of the first pad electrode 145 and the second pad electrode 165 includes a plurality of branches.

In an embodiment, in a plan view, the edge of the first pad electrode 145 overlaps the edge of the second pad electrode 165. For example, the edge of the first pad electrode 145 and the edge of the second pad electrode 165 may be vertically aligned and vertically overlapped with each other. In a plan view, the edge of the third pad electrode 310 is positioned at an outside of the edges of the first pad electrode 145 and the second pad electrode 165 in a plan view.

While the present invention has been described in connection with what are presently considered to be some practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. A display device comprising:
    a substrate including a display area configured to display an image and a non-display area positioned outside the display area;
    a pad portion in the non-display area of the substrate and including a plurality of pads;
    a driver arranged at the pad portion to contact the pads;
    an interlayer insulating layer on the substrate; and
    an auxiliary layer in the non-display area of the substrate,
    wherein each of the pads includes a first pad electrode, a second pad electrode, and a third pad electrode, which are sequentially arranged on the substrate,
    wherein a width of the third pad electrode is greater than a width of the second pad electrode and a width of the first pad electrode, and the width of the second pad electrode is greater than the width of the first pad electrode,
    the interlayer insulating layer is arranged between the first pad electrode and the second pad electrode,
    the auxiliary layer is between the second pad electrode and the third pad electrode, and
    a thickness of a first portion of the auxiliary layer between an outer peripheral edge of the third pad electrode and the interlayer insulating layer is thicker than a thickness of a second portion of the auxiliary layer between the third pad electrode and the second pad electrode, an upper surface of the auxiliary layer at the first and second portions being at a same height from the substrate.

2. The display device of claim 1, wherein the auxiliary layer includes an organic material.

3. The display device of claim 2, wherein the driver includes:
    a circuit board configured to include a driving circuit; and
    a bump electrode arranged on a surface of the circuit board to contact the third pad electrode.

4. The display device of claim 3, further comprising:
    a semiconductor layer on the substrate in the display area;
    a gate insulating layer on the semiconductor layer;
    a gate electrode on the gate insulating layer;
    a source electrode and a drain electrode on the gate electrode;
    a planarization layer on the source electrode and the drain electrode; and
    a light emitting diode arranged on the planarization layer to be connected with the drain electrode,
    wherein the interlayer insulating layer is between the gate electrode, the source electrode, and the drain electrode.

5. The display device of claim 4, wherein the first pad electrode includes a same material as a material of the gate electrode, and
    the second pad electrode includes a same material as a material of the source electrode and the drain electrode.

6. The display device of claim 5, wherein the light emitting diode includes:
a first electrode on the planarization layer;
an emission member on the first electrode; and
a second electrode on the emission member.

7. The display device of claim 6, further comprising:
a pixel definition layer arranged on the planarization layer to overlap a portion of the first electrode;
an encapsulation layer on the light emitting diode; and
a touch sensing layer on the encapsulation layer.

8. The display device of claim 7, wherein the touch sensing layer includes:
a first sensing electrode on the encapsulation layer;
a first touch insulating layer on the first sensing electrode;
a second sensing electrode on the first touch insulating layer; and
a second touch insulating layer on the second sensing electrode.

9. The display device of claim 8, wherein the third pad electrode includes a same material as a material of the first sensing electrode or the second sensing electrode.

10. The display device of claim 9, wherein the width of the third pad electrode is greater than the width of the first pad electrode and the width of the second pad electrode in a plan view.

11. The display device of claim 10, wherein the auxiliary layer includes a same material as a material of the first touch insulating layer.

12. The display device of claim 11, wherein the third pad electrode includes a same material as a material of the second sensing electrode.

13. The display device of claim 10, wherein the auxiliary layer includes a same material as a material of the planarization layer.

14. The display device of claim 10, wherein the auxiliary layer includes a same material as a material of the pixel definition layer.

15. The display device of claim 10, wherein the encapsulation layer includes an inorganic layer and an organic layer which are alternately arranged.

16. The display device of claim 15, wherein the auxiliary layer includes a same material as a material of the organic layer.

17. The display device of claim 10, wherein each of the first pad electrode and the second pad electrode includes a plurality of branches.

18. The display device of claim 17, wherein an edge of the third pad electrode is positioned outside of edges of the first pad electrode and the second pad electrode, in a plan view.

19. The display device of claim 1, wherein the second pad electrode is connected with the first pad electrode through an opening in the interlayer insulating layer.

20. The display device of claim 1, wherein a thickness of the second portion of the auxiliary layer is thicker than a thickness of a third portion of the auxiliary layer between the third pad electrode and the second pad electrode and overlapping the first pad electrode, the upper surface of the auxiliary layer at the second and third portions being at the same height from the substrate.

\* \* \* \* \*